(12) United States Patent
Lee et al.

(10) Patent No.: US 11,024,740 B2
(45) Date of Patent: Jun. 1, 2021

(54) ASYMMETRIC CHANNEL THRESHOLD VOLTAGE

(71) Applicant: International Business Machines Corporation, Armonk, NY (US)

(72) Inventors: Choonghyun Lee, Albany, NY (US); Takashi Ando, Tuckahoe, NY (US); Alexander Reznicek, Troy, NY (US); Jingyun Zhang, Albany, NY (US); Pouya Hashemi, Purchase, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/420,118

(22) Filed: May 22, 2019

(65) Prior Publication Data
US 2020/0373429 A1   Nov. 26, 2020

(51) Int. Cl.
*H01L 29/78* (2006.01)
*H01L 29/161* (2006.01)
*H01L 29/66* (2006.01)
*H01L 21/84* (2006.01)
*H01L 29/10* (2006.01)
*H01L 21/02* (2006.01)
(Continued)

(52) U.S. Cl.
CPC .... *H01L 29/7851* (2013.01); *H01L 21/02532* (2013.01); *H01L 21/324* (2013.01); *H01L 21/845* (2013.01); *H01L 27/1211* (2013.01); *H01L 29/1033* (2013.01); *H01L 29/161* (2013.01); *H01L 29/6653* (2013.01); *H01L 29/6656* (2013.01); *H01L 29/66545* (2013.01); *H01L 29/66553* (2013.01); *H01L 29/66795* (2013.01)

(58) Field of Classification Search
None
See application file for complete search history.

(56) References Cited

U.S. PATENT DOCUMENTS 8,237,197 B2   8/2012   Chen et al.
8,263,446 B2   9/2012   Cheng et al.
(Continued)

FOREIGN PATENT DOCUMENTS

WO   WO/2018/211379   11/2018

OTHER PUBLICATIONS

Ki-Ju Baek; Kee-Yeol Na; Subin Kim; Device Optimization of N-Channel MOSFETs with Lateral Asymmetric Channel Doping Profiles, Transactions on Electrical and Electronic Materials, Feb. 2010; DOI: 10.4313/TEEM, 2010.11.1.015.
(Continued)

*Primary Examiner* — Long Pham
(74) *Attorney, Agent, or Firm* — Erik K. Johnson; Lou Percello, Attorney, PLLC

(57) ABSTRACT

A SiGe channel FinFET structure has an asymmetric threshold voltage, Vth, laterally along the SiGe channel. Uses of sacrificial layers, selective Ge condensation, and/or the use of spacers enable precise creation of first and second channel regions with different Ge concentration, even for channels with short lengths. The second channel region near the source side of the device is modified with a selective Germanium (Ge) condensation to have a higher Vth than the first channel region near the drain side. A lateral electric field is created in the channel to enhance carrier mobility.

20 Claims, 12 Drawing Sheets

(51) Int. Cl.
*H01L 21/324* (2006.01)
*H01L 27/12* (2006.01)

(56) References Cited

U.S. PATENT DOCUMENTS

| | | |
|---|---|---|
| 8,513,073 B1 | 8/2013 | Basker et al. |
| 9,437,738 B2 | 9/2016 | Lin |
| 9,543,435 B1 * | 1/2017 | Basker .................. H01L 29/785 |
| 9,570,590 B1 | 2/2017 | Doris et al. |
| 9,583,624 B1 | 2/2017 | Lam et al. |
| 9,698,226 B1 | 7/2017 | McArdle et al. |
| 9,837,403 B1 | 12/2017 | Bi et al. |
| 9,859,423 B2 * | 1/2018 | Liu .................... H01L 29/66545 |
| 10,229,856 B2 | 3/2019 | Ando et al. |
| 10,249,540 B2 | 4/2019 | Ando et al. |
| 2016/0104775 A1 * | 4/2016 | Yoo ................. H01L 21/823431 |
| | | 257/190 |

OTHER PUBLICATIONS

K. Narasimhulu; Dinesh K. Sharma; V. Ramgopal Rao; Impact of Lateral Asymmetric Channel Doping on Deep Submicrometer Mixed-Signal Device and Circuit Performance; IEEE Transactions on electron Devices, vol. 50, No. 12, Dec. 2003.

Lee et al.; Understanding the Interfacial Layer Formation on Strained Si1-xGex Channels and Their Correlation to Inversion Layer Hole Mobility; IBM Research, 257 Fuller Road, Suite 3100, Albany, NY 12203; T9-4; 2017 Symposium on VLSI Technology Digest of Technical Papers.

\* cited by examiner

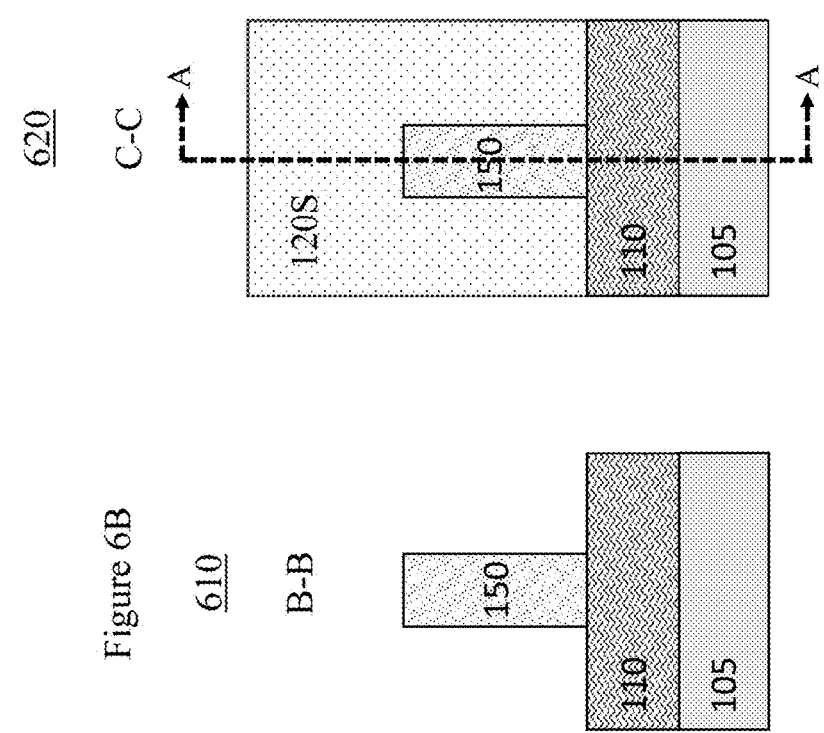
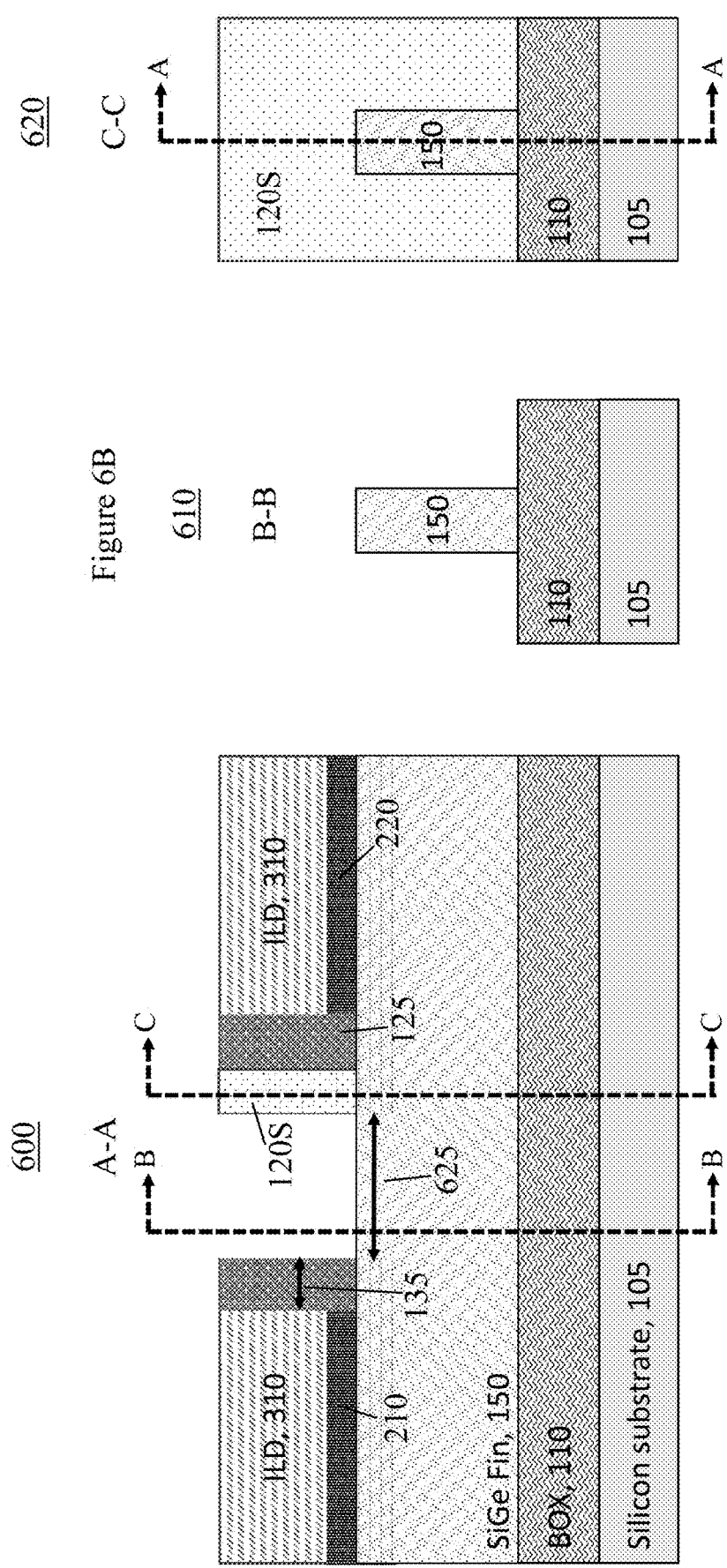

720
C-C

710
B-B

700
A-A

820

810

800

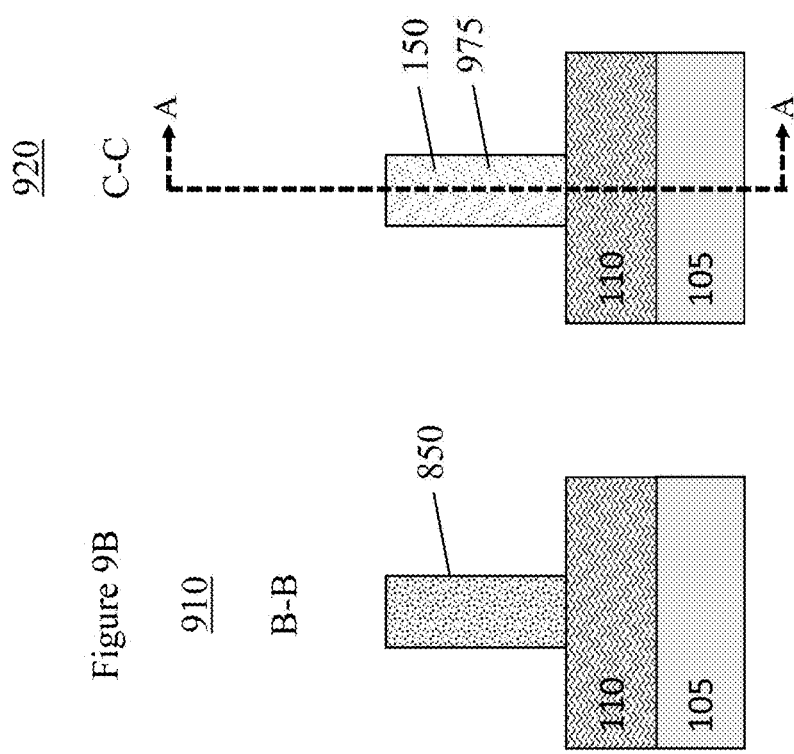
Figure 9C
920
C-C
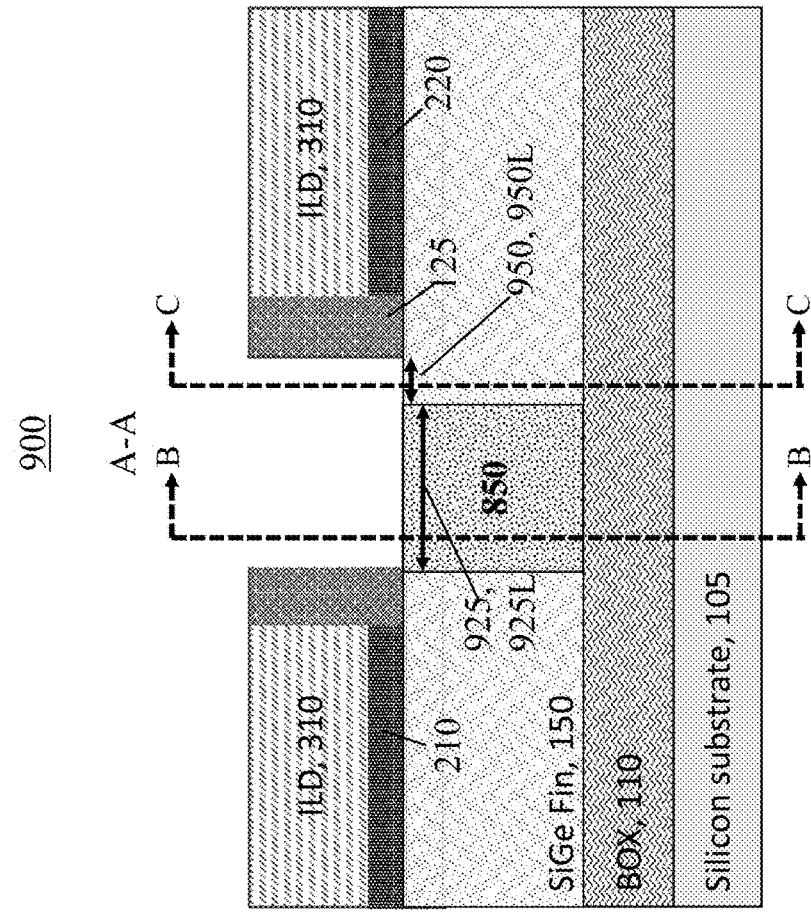
Figure 9B
910
B-B
Figure 9A
900
A-A

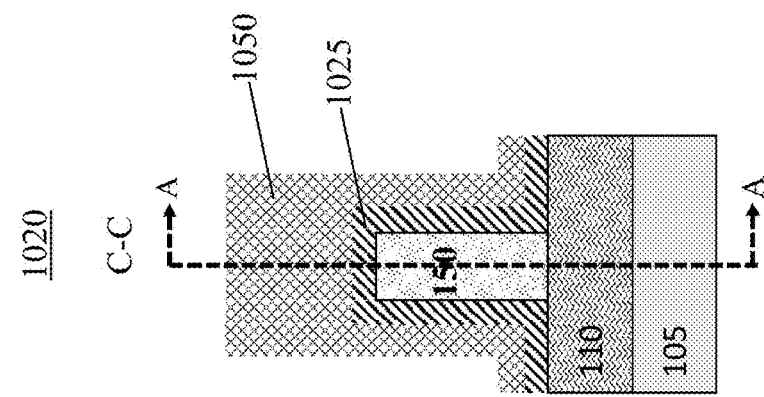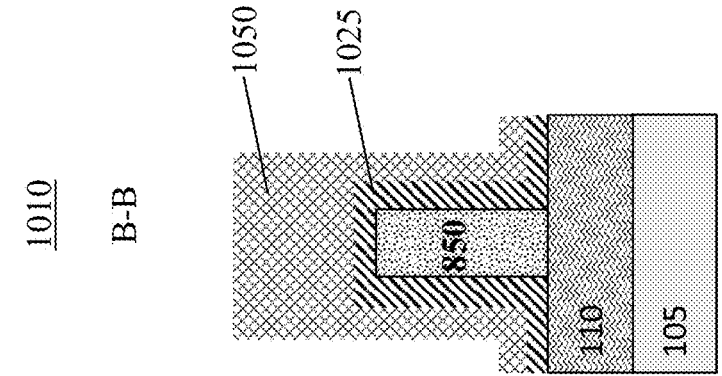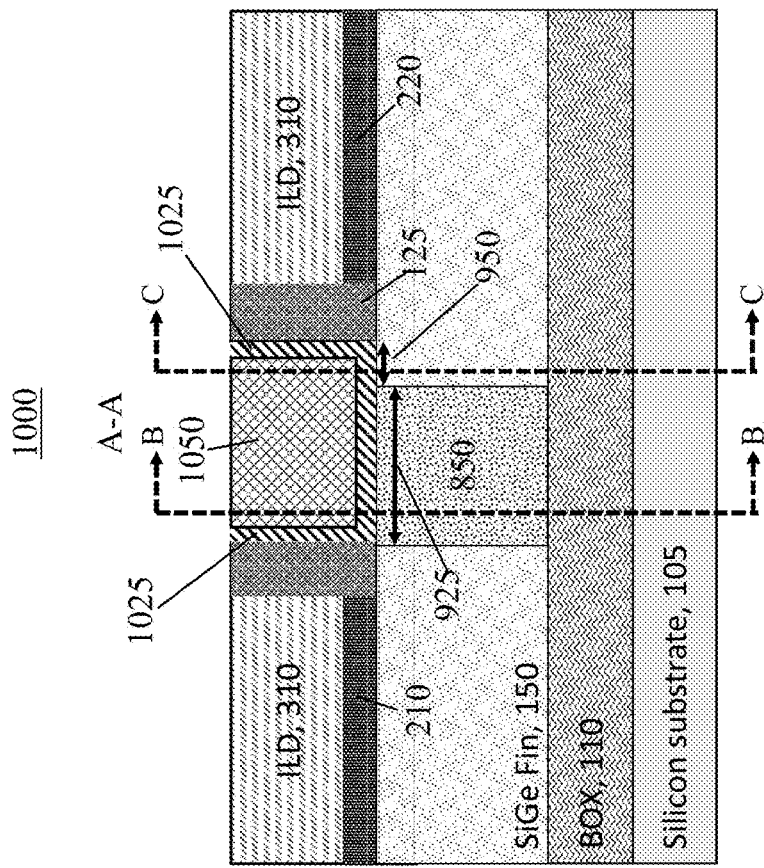

ASYMMETRIC CHANNEL THRESHOLD VOLTAGE

BACKGROUND

The present invention relates to Metal Oxide Semiconductor Field Effect Transistors (MOSFETs). More specifically, the invention relates to MOSFETs with improved electrical characteristics.

A lateral asymmetric channel (LAC) doping profile approach provides one of the most effective ways to improve the electrical characteristics of MOSFETs. For the LAC MOSFET, the doping concentration of the source side is higher than that of the drain side in the channel.

While the LAC MOSFET is operating, the channel voltage potential transition at the source side channel region is much steeper than those MOSFETs with uniform channel doping. Such a steep potential distribution near the source side enhances the lateral channel electric field and thus increases the carrier mobility.

Steep voltage potential transitions in the channel region are difficult to achieve for state-of-the-art devices because their channel lengths are short, e.g. less than 20 nanometers (nm) long. In short channels it is also difficult to precisely align the doping regions along these short channels because the charged carriers can migrate distances that are a larger percentage of the total channel length.

SUMMARY

Embodiments of this invention include a SiGe channel FinFET structure having an asymmetric threshold voltage, Vth, distribution along the SiGe channel. A portion of the SiGe channel near the drain side of the device is modified with a selective Germanium (Ge) condensation. Use of sacrificial layers, selective Ge condensation, and/or use of spacers enable precise creation of regions of the channel with different Ge concentration, even for channels with short lengths. Creation of an asymmetric Vth profile laterally along the channel can be accurately controlled by controlling the atomic concentration of Ge to be different in two regions along the channel.

BRIEF DESCRIPTION OF THE DRAWINGS

FIG. 6A is a cross section of the elevation of a FINFET interim structure after the step of removing the mask showing a first elevation view, B-B, through first part of the channel region, and a second elevation view, C-C through a second part of the channel region.

FIG. 6B is the first elevation view B-B of FIG. 6A.

FIG. 6C is the second elevation view C-C of FIG. 6A also showing an elevation view, A-A, as shown in FIG. 6A.

FIG. 9A is a cross section of the elevation of a FINFET interim structure after the steps of removing the remaining GeO2 layer, a converted SiO2 layer, and the source side inner spacer and an illustration of the created first and second channel regions.

FIG. 9B is the first elevation view B-B of FIG. 9A showing the created first channel region.

FIG. 9C is the second elevation view C-C of FIG. 9A showing the created second channel region.

FIG. 10A is a cross section of the elevation of a FINFET structure after the step of forming a gate by depositing a high-k dielectric and a gate metal.

FIG. 10B is the first elevation view B-B of FIG. 8A after forming the gate.

FIG. 10C is the second elevation view C-C of FIG. 8A after forming the gate.

DETAILED DESCRIPTION

Figure 1:
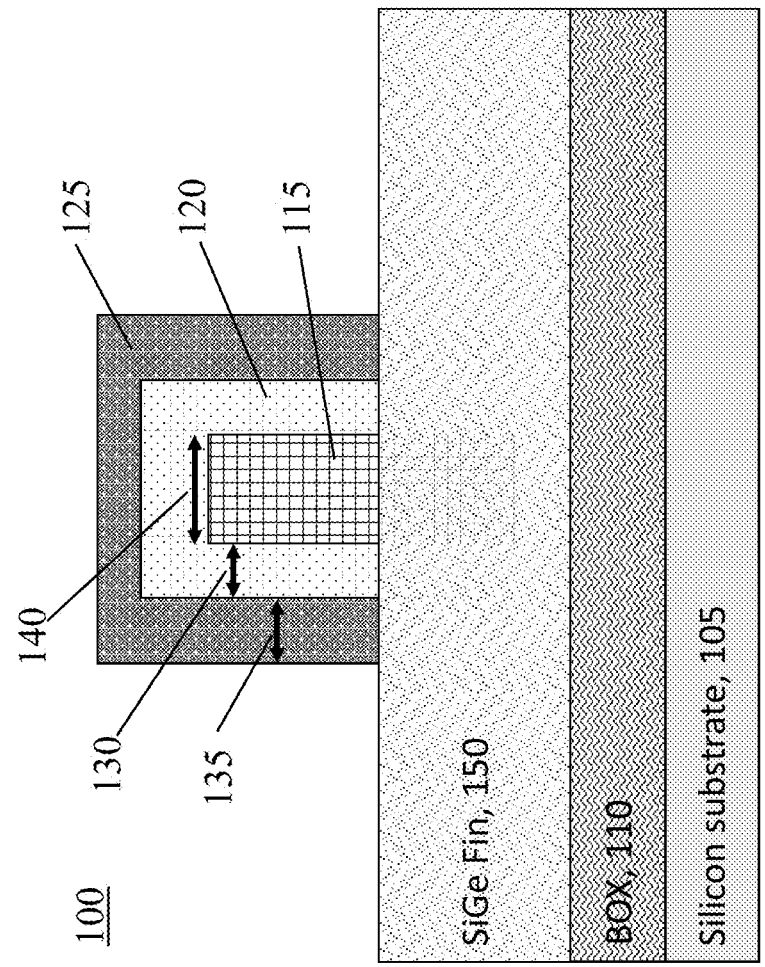
FIG. 1 is a cross section of an elevation of a beginning structure of a FINFET with an inner spacer and an outer spacer layer around a dummy gate.

If the channel voltage potential at the source side of the channel is relatively high, and especially if there is a steep voltage transition when moving away from the source, the lateral channel electric field (from source to drain) is enhanced. The stronger lateral channel electric field increases carrier mobility through the channel from source to drain. This asymmetric voltage potential profile laterally along the channel is difficult to create in short channels (shorter than 20 nanometers) by channel doping because dopants diffuse imprecisely along larger proportions of the channel length.

Alternatively, an asymmetric voltage potential profile laterally along the channel can be created by controlling Germanium (Ge) concentration along the length of a SiGe channel. The present invention discloses methods and devices enabling different Ge concentrations and therefore different Vth along the length of the channel. The invention enables precise alignment, positioning, and concentrations of Ge along the channel.

In some embodiments, the region of the channel with higher concentrations of Ge, and consequently lower Vth, is between 50 to 80 percent of the total channel length and is on the drain side of the channel. This leaves 20-50 percent of total channel length on the source side with a higher Vth and lower Ge concentration. The sum of the first and second lengths equals the entire channel length.

In this disclosure, the concentration of Ge is measured as an "atomic concentration," i.e., the number of Ge atoms in the material/channel divided by the total number of atoms in the material/channel.

Therefore, the MOSFET has two precisely defined regions of the channel with distinct and different Ge concentrations. A first channel region is on the drain side with a higher Ge concentration; a first, longer channel length; and a lower Vth. A second channel region is on the source side with a lower Ge concentration; a second, shorter length; and a higher Vth.

The first channel region has a Ge concentration between 20 to 60 percent Ge. The second channel region has a Ge concentration between 10 to 30 percent Ge.

The lower Vth in the higher Ge concentration region near the drain is between 0.1 volts (V) and 0.3 V. The higher Vth in the lower Ge concentration region near the source is between 0.2 V and 0.5 V. The voltage difference between the source and drain can be accurately controlled by controlling the atomic concentration of Ge along the channel. In some embodiments, the Vth at the source is at least 0.1 volts higher than the Vth at the drain. In other embodiments, the voltage difference is at least 0.2 V.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness". "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Unless otherwise specifically noted, the same reference numbers in different figures have the same description and refer to the same elements.

The figures are not drawn to scale. For example, the height of the dummy gate 115 is much greater than the width 140 of the dummy gate 115.

FIG. 1 is a cross section (see below for more description) of an elevation of a beginning structure of an FINFET 100 with an inner spacer 120 layer and an outer spacer 125 layer around a dummy gate 115 disposed on the top and on the sides of one of a plurality of fins 150.

The fins 150 are made of silicon-germanium, SiGe.

In some embodiments, the plurality of fins 150 is disposed on a silicon-on-insulator (SOI) structure. The fins are disposed on an oxide or BOX layer 110. The BOX 110 is disposed on a silicon substrate 105.

In alternative embodiments, there is no BOX layer 110 and the SiGe fin 150 is disposed directly on the substrate 105.

The substrate 105 is made of one or more semiconductor materials. Non-limiting examples include: Si (silicon), strained Si, (silicon carbide), Ge (germanium), SiGe (silicon germanium), Si alloys, Ge alloys, III-V materials (e.g., GaAs (gallium arsenide), InAs (indium arsenide), InP (indium phosphide), or aluminum arsenide (AAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

In some silicon on insulator (SOI) implementations, the box layer 110 is a buried oxide layer oxide layer (e.g., SiO2) buried in the substrate (wafer) 105 at the depth ranging from less than 100 nm to several micrometers from the wafer surface depending on application. The thickness of BOX layer 110 is typically in the range from about 40 nm to about 100 nanometers (nm).

In alternative embodiments, the bottom substrate 105 is made of bulk semiconductor material including, but not limited to, silicon (Si), silicon germanium (SiGe), carbon doped silicon (Si:C), carbon doped silicon germanium (SiGe:C), III-V compound semiconductors, II-V compound semiconductors, or other like semiconductors. In addition, multiple layers of the semiconductor materials can be used. In some embodiments, the fins 150 are disposed directly on the bulk substrate 105 and no Box layer 110 is included.

It is possible to purchase structures with fins 150 disposed on bulk substrates 105 and/or SOI (substrate 105 on BOX 110).

Known techniques first deposit one of the dummy gates 115 on each of one or more of the fins 150. (Masking steps are not shown for clarity.)

The dummy gate 115 is made of a sacrificial gate material including, for example, amorphous silicon (α-Si) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. In some embodiments, the sacrificial material forming the dummy gate 115 has a height of about 30 nm to about 150 nm, or alternatively from about 30 nm to about 100 nm. In some embodiments, the dummy gate 115 has a width 140 of between 10 nm and 50 nm or alternatively about 10 nm. Other heights and widths 140 are possible.

The deposition techniques enable the height and width 140 of the dummy gate 115 to be controlled and positioned precisely on and around the sides (see below) of the fin 150.

Next the inner spacer 120 material is disposed on and around the dummy gate 115 and on and around (see below) the fin 150. In some embodiments, the inner spacer 120 is disposed conformally on the surface of the dummy gate 115 and portions of the top and sides of the fin 150. In some embodiments the width/thickness 130 of the inner spacer 120 is between 3 and 10 nm. In alternative embodiments, the inner spacer 120 thickness 130 is about 5 nm to 7 nm. In some embodiments, the width 130 of the inner spacer 120 on the source side (source side inner spacer) ultimately determines the second channel length, the region having lower Ge concentration. By accurately positioning the dummy gate 115 with a precisely controlled width 140 and by controlling the thickness 130 of the drain side inner spacer 120D (described below), the first channel length of the first channel region (on the drain side with the higher Ge concentration) is also determined, controlled, and accurately positioned.

The spacers (120, 125) are dielectric materials that can be removed by selective etching, e.g., either through RIE or wet etching.

In an embodiment, the inner spacer 120 is made of a silicon oxide, e.g. SiO2.

In alternative embodiments, the inner spacer 120 can be made of materials including: dielectric oxides (e.g., silicon oxide), dielectric nitrides (e.g., silicon nitride), dielectric oxynitrides, or any combination thereof.

Next the outer spacer (or gate spacer) 125 material is disposed on and around the inner spacer 120 and on and around (see below) the fin 150. In some embodiments, the outer spacer 125 is disposed conformally on the surface of the inner spacer 120 and portions of the fin 150. In some embodiments the width/thickness 135 of the outer spacer 125 is between 3 and 10 nm. In alternative embodiments, the outer spacer 125 thickness 135 is about 6 nm. The boundary between the inner 120 and outer 125 spacers can determine the positioning of the channel and the total channel length in the fin 150 between the source 220 and drain 210 (as shown in FIG. 2).

In some embodiments, the outer spacer 125 is made of any low k materials including: dielectric nitrides (e.g., silicon nitride). SiCO, SiBCN, dielectric oxynitrides, or any combination thereof, as long as there is at least one process that can selectively remove all or part of the inner spacer 120 material without removing the outer spacer 125.

The inner and outer spacers (120, 125) are deposited by a deposition process, for example, chemical vapor deposition (CVD) or Atomic Layer Deposition (ALD). These deposition processes allow the thickness of the inner and outer spacers (120, 125) to be precisely controlled.

Figure 2:
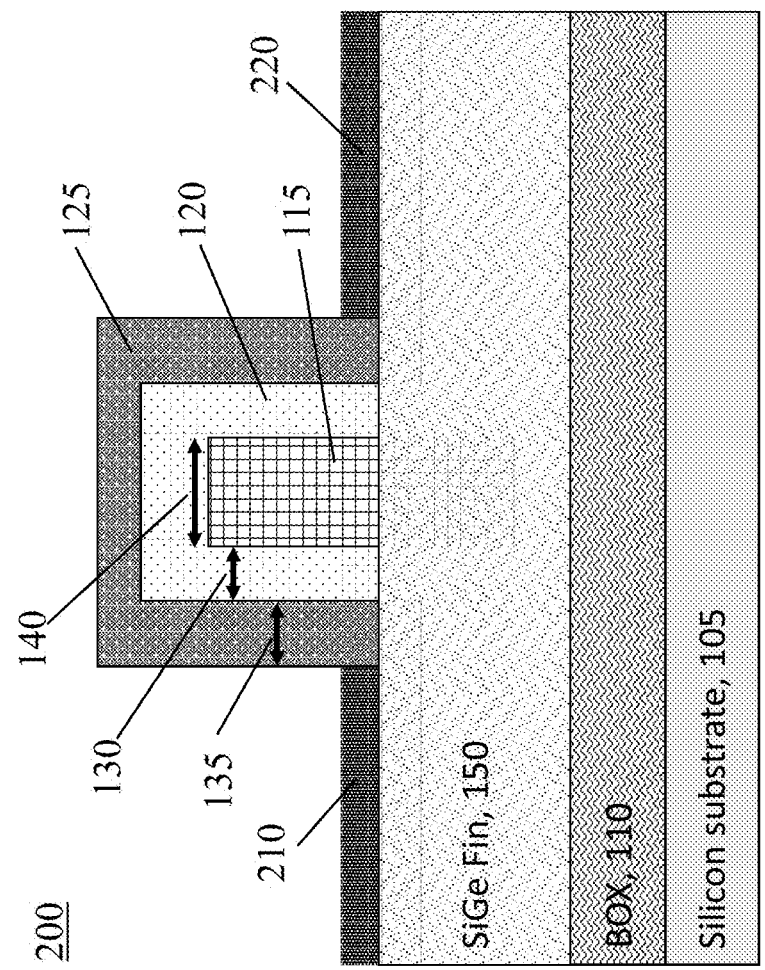
FIG. 2 is a cross section of the elevation of a FINFET interim structure after the step of adding a source and a drain.

FIG. 2 is a cross section of the elevation of the structure 200 after the step of adding a source 220 and a drain 210.

An n-channel FET (NFET) is made by doping drain region 210 and source region 220 with a n-type dopant. The drain 210 and source 220 can be formed on the fin 150 by incorporating dopants into the fin 150 or forming an epitaxial growth on the fin 150.

For the NFET, the n-type dopant is selected from a group of phosphorus (P), arsenic (As) and antimony (Sb), at various concentrations. In some embodiments, the drain 210 and source 220 are heavily doped, including a dopant concentration in a range from about $4 \times 10^{20}$ cm$^{-3}$ to about $2.5 \times 10^{21}$ cm$^{-3}$. The thickness of the doped drain 210 and source 220 may be in a range from about 50 nm to about 250 nm, or from about 70 nm to about 100 nm.

As an alternative embodiment, a p-channel FET (PFET) is made by doping drain region 210 and source region 220 with an p-type dopant.

For the PFET, the n-type dopant is selected from a group of boron (B), gallium (Ga), indium (In), and thallium (Tl), at various concentrations. In an embodiment, the drain 210 and source 220 are heavily doped, including a dopant concentration in a range from about $4 \times 10^{20}$ cm$^{-3}$ to about $2.5 \times 10^{-3}$ cm. The thickness of the doped drain 210 and source 220 may be in a range from about 50 nm to about 250 nm, or from about 70 nm to about 100 nm.

The drain 210 is electrically, chemically, and physically connected to a drain side of the channel.

The source 220 is electrically, chemically, and physically connected to a source side of the channel.

In some embodiments, the drain 210 and source 220 are grown in-situ. Dopants can be added during the epitaxy.

Figure 3:
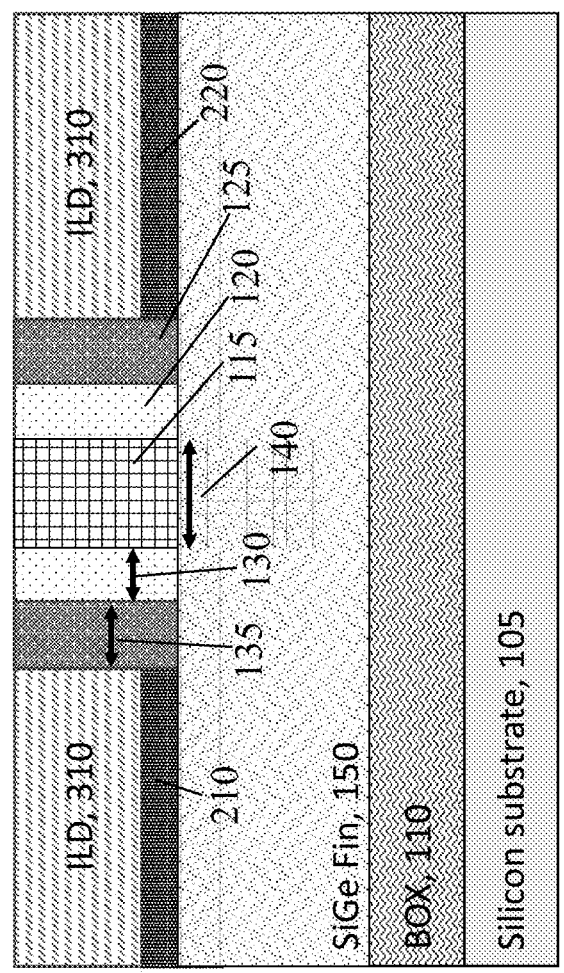
FIG. 3 is a cross section of an elevation of a FINFET interim structure after the steps of adding an interlayer dielectric (ILD) layer and performing a chemical and mechanical polishing (CMP.)

FIG. 3 is a cross section of an elevation of the FINFET structure 300 after the steps of adding an interlayer dielectric (ILD) layer 310 and performing a chemical and mechanical polishing (CMP)

The material in the ILD 310 can be a low-k dielectric material (with k<4.0), including but not limited to, silicon oxide, spin-on-glass, a flowable oxide, a high-density plasma oxide, or any combination thereof. The ILD 310 is deposited by a deposition process, including, but not limited to chemical vapor deposition (CVD,) physical vapor deposition (PVD,) plasma enhanced CVD, atomic layer deposition (ALD), evaporation, chemical solution deposition, or like processes.

The CMP levels the top of the structure 300 and removes the "overlayer" of the spacers (120, 125) over the dummy gate 115 so that the tops of the spacers (120, 125), the top of the dummy gate 115, and the top of the ILD are coplanar.

Figure 4:
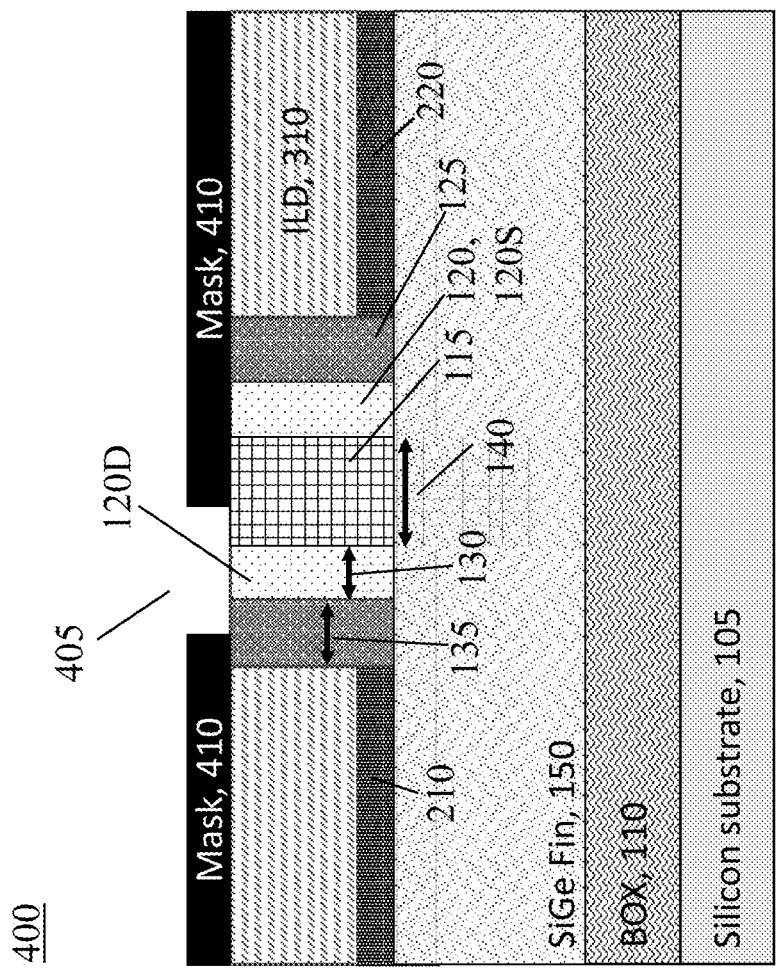
FIG. 4 is a cross section of the elevation of a FINFET interim structure after the step of adding a mask with an offset opening to exposing the inner spacer on the drain side of the dummy gate while protecting the inner spacer on the source side of the dummy gate.

FIG. 4 is a cross section of the elevation of the FINFET structure 400 after the step of adding a mask 410 with an offset mask opening 405 to exposing the inner spacer 120 on the drain 210 side (drain side inner spacer 120D) of the dummy gate 115 while protecting the inner spacer 120 on the source 220 side (source side inner spacer 120S) of the dummy gate 115. The mask opening 405 partially exposes the dummy gate 115 but does not expose the source side inner spacer 120S.

To enable etch selectivity, the mask 410 can be a hard mask made of materials different from the materials of which the inner 120 and outer 125 spacer are made. The mask 410 and the offset mask opening 405 are positioned and deposited by standard techniques including spin coating.

Figure 5:
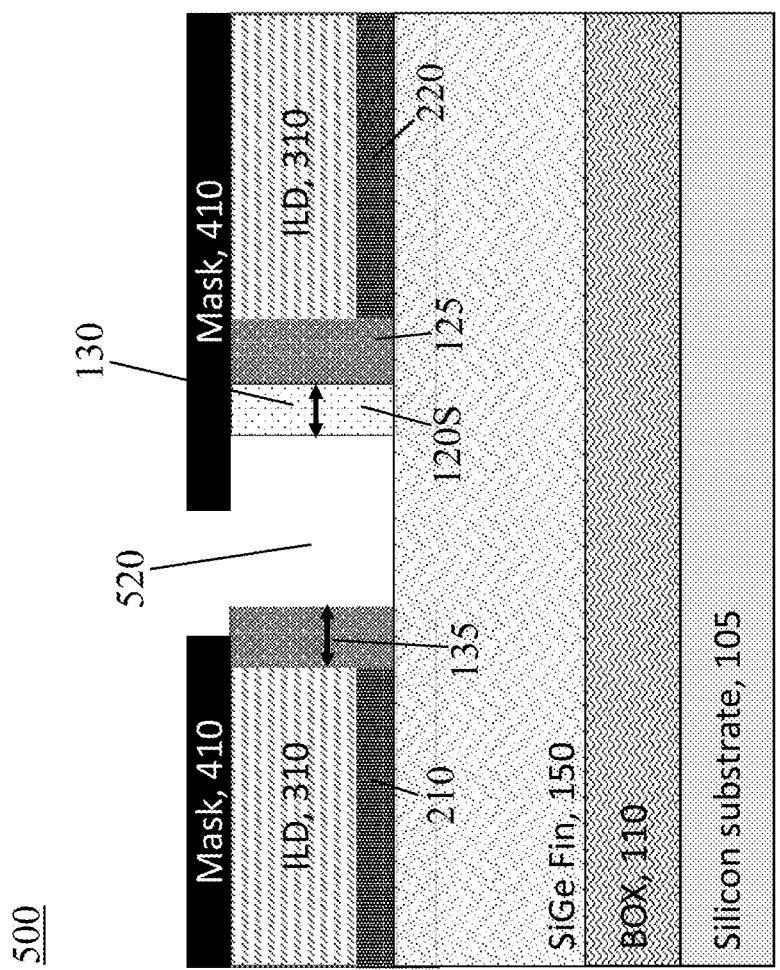
FIG. 5 is a cross section of the elevation of a FINFET interim structure after the step of removing (pulling) the exposed drain side inner spacer and dummy gate.

FIG. 5 is a cross section of the elevation of the FINFET structure 500 after the step of removing (pulling) the exposed drain side inner spacer 120D and dummy gate 115. At the completion of this step, there is a volume 520 void of material above the first channel region of the channel while the source side inner spacer 120S remains in place covering the second channel region.

The void 520 can be created by first performing a wet or dry etch to remove the drain side inner spacer 120D. The drain side inner spacer 120D can be removed by exposing it to a diluted hydrofluoric acid (DHF, e.g. diluted at about 100 to 1) or a buffered hydrofluoric acid (BHF). The dummy gate 115 is removed by a dry etch or exposure to a hot ammonia (NA4OH) at higher than room temperature.

FIG. 6A is a cross section of the elevation of the FINFET structure 600 after the step of removing the mask 410 and exposing the first channel region 625. In an embodiment, the mask 410 is removed by exposure to a plasma comprising O2, H2, N2 or a combination of thereof. The plasma selectively removes the mask 410 material but does not affect the SiGe material of the fin 150 or the materials making up the spacers (120, 125) and ILD 310.

FIG. 6A also shows a first elevation view, B-B, through the first channel region, and a second elevation view, C-C, through the second channel region.

FIG. 6B is the first elevation view B-B of FIG. 6A. The view B-B only shows the view on the plane of view B-B. Nothing behind the plane B-B is shown. Since the dummy gate 115 and the drain side inner spacer 120D are removed in structure 600, structure 610 shows the fin 150 with material neither on the side nor on top of the fin 150. View B-B is a cross section elevation view of the first channel region 625 before the condensation of Ge.

FIG. 6C is the second elevation view C-C of FIG. 6A as structure 620. The plane of view C-C cuts through the source side inner spacer 120S. Therefore, the source side inner spacer 120S material is shown on either side and on top of the fin 150 in view C-C.

FIG. 6C also shows an elevation view, A-A, showing the cross section cut axially through the fin 150 as shown in FIG. 6A and in FIGS. 1 through 5.

Figure 7C:
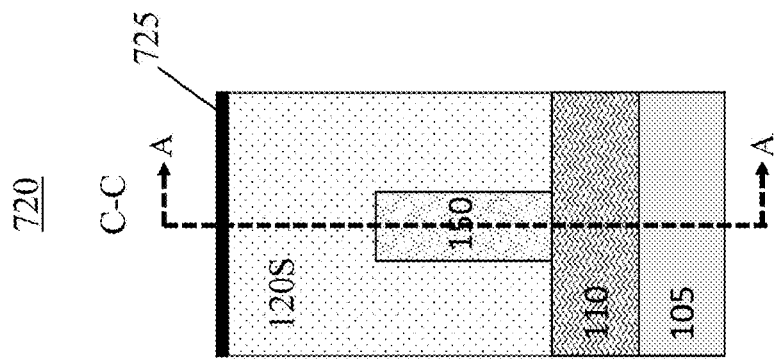
FIG. 7C is the second elevation view of FIG. 7A after the GeO2 layer deposition.
Figure 7B:
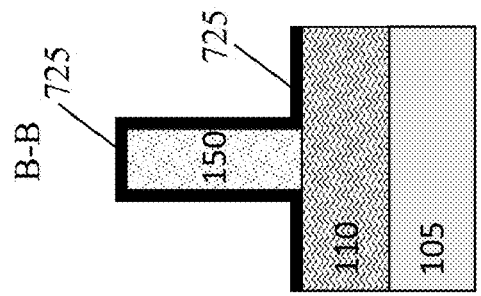
FIG. 7B is the first elevation view of FIG. 7A after the GeO2 layer deposition.
Figure 7A:
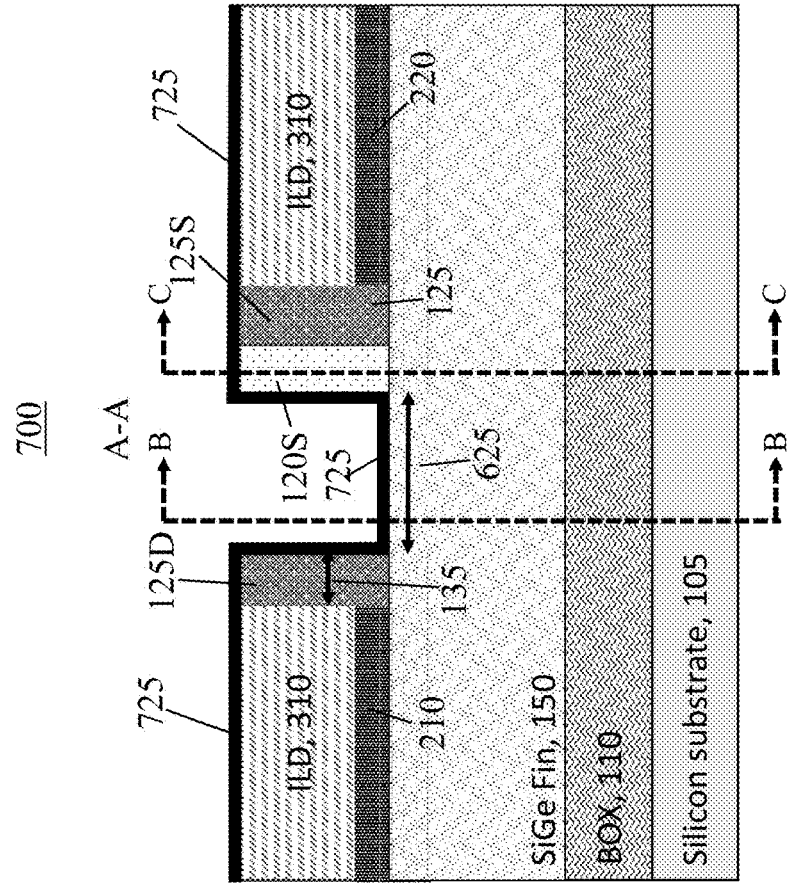
FIG. 7A is a cross section of the elevation of a FINFET interim structure after the step of depositing a layer of Germanium Oxide (e.g. GeO2) for selective Ge condensation.

FIG. 7A is a cross section of the elevation of the FINFET structure 700 after the step of depositing a layer of germanium oxide (e.g. GeO2) 725 for selective Ge condensation.

In an embodiment, the GeO2 is applied in a conformal deposition 725 using atomic layer deposition (ALD). Using ALD, the thickness of the GeO2 layer can be controlled to atomic tolerances. As described below, control of the thickness of the GeO2 layer allows very accurate control of the Ge concentration in the first channel region after the Ge condensation anneal.

In some embodiments, the GeO2 conformally deposits 725 on the surface of the first channel region 625, along the sides of the drain side outer spacer 125D, along the side of the source side inner spacer 120S, and over the top of the structure 700. In some embodiments, the GeO2 deposited has a thickness of between 3 nm and 7 nm, alternatively around 5 nm thick.

FIG. 7B is the first elevation view B-B 710 of FIG. 7A after the GeO2 layer deposition looking laterally (axially) into a cross section elevation view of the first channel region 625 of the structure 700 before the Ge condensation/anneal described below. This view shows that the GeO2 also deposits around the sides of the fin 150 as well as on the top of the fin 150.

FIG. 7C is the second elevation view C-C 720 of FIG. 7A after the GeO2 layer deposition showing the deposition of GeO2 occurring at this point along the fin 150 only on the source side inner spacer 120S. At these point along the fin 150, as well as along regions on the ILD 310, there is no contact between the GeO2 and the SiGe fin 150 material.

As will be explained below, the deposition of GeO2 will only have an effect in first channel region 625 of the fin 150 where the GeO2 is in physical contact with the SiGe on the top and sides of the fin 150.

Figure 7D:
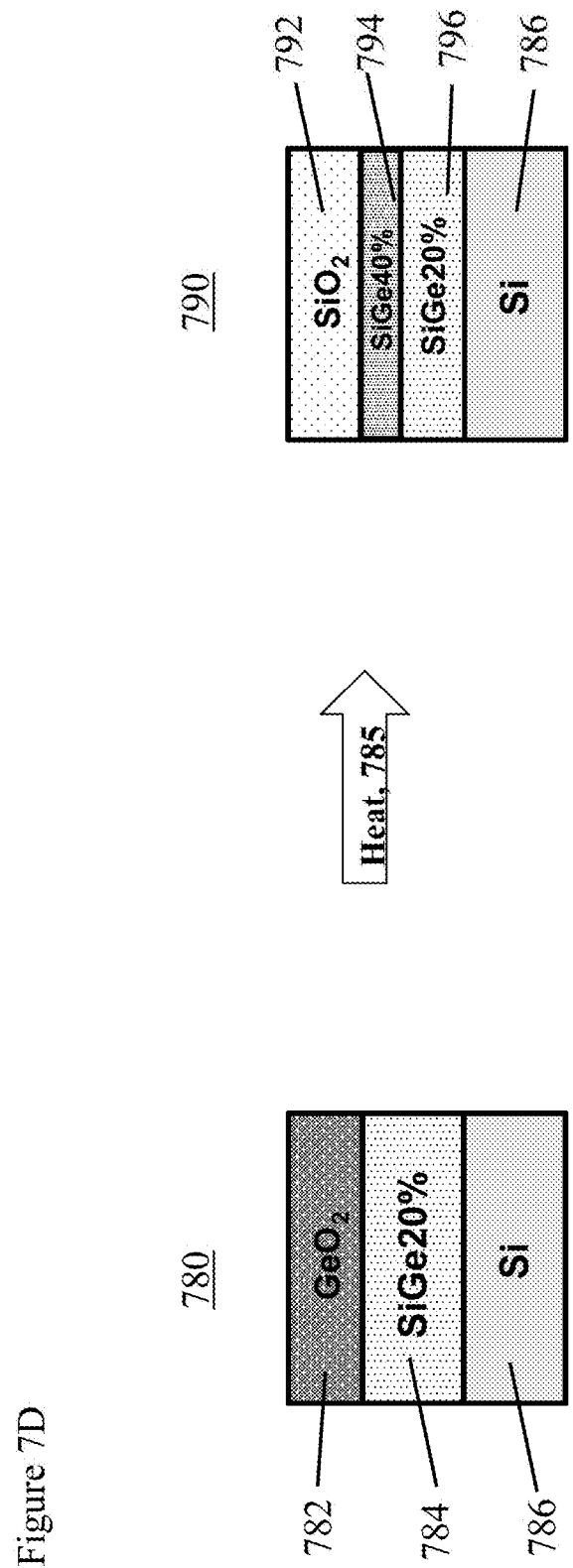
FIG. 7D shows a chemical transformation between the GeO2 layer and the SiGe fin material that occurs at an elevated temperature.
Figure 8C:
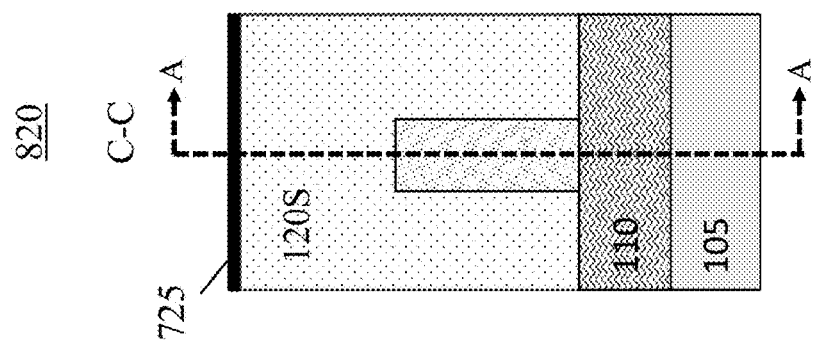
FIG. 8C is the second elevation view C-C of FIG. 8A after the selective Ge condensation and anneal.
Figure 8B:
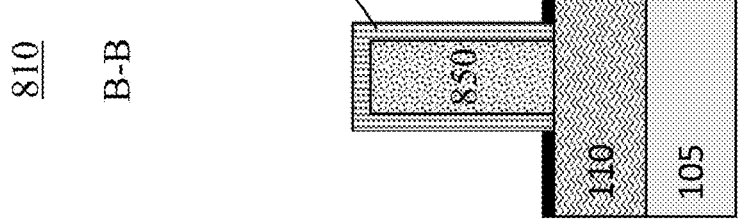
FIG. 8B is the first elevation view B-B of FIG. 8A after the step of selective Ge condensation and anneal.
Figure 8A:
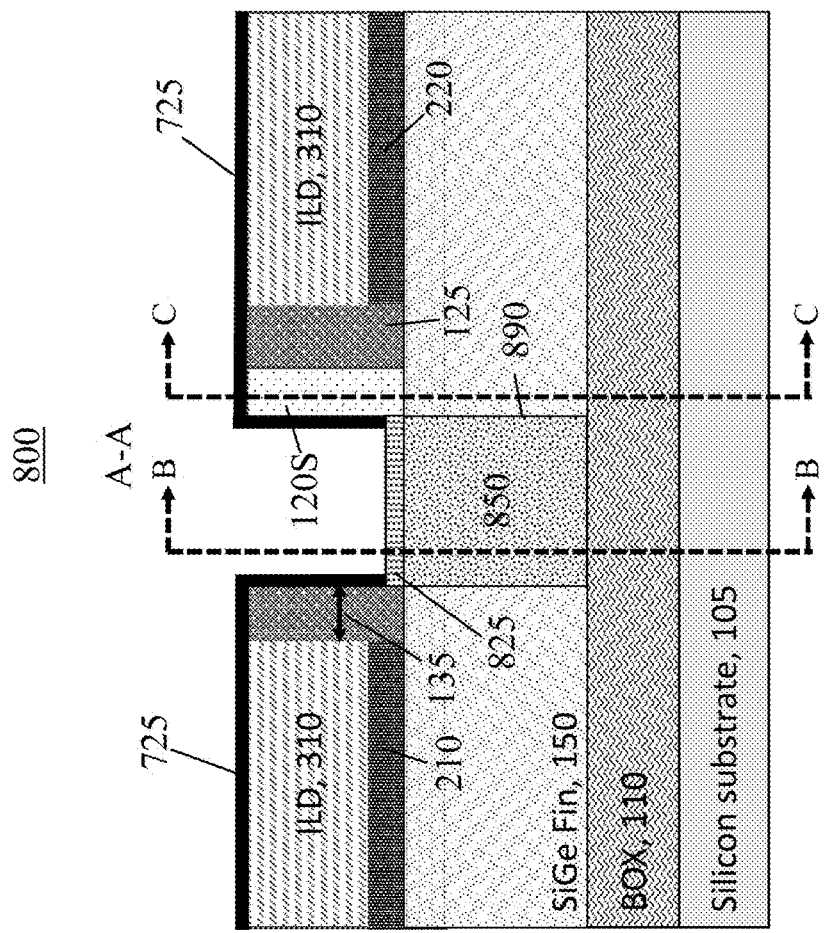
FIG. 8A is a cross section of the elevation of a FINFET interim structure after the step of selective Ge condensation and anneal.

FIG. 7D shows the chemical transformation between the GeO2 layer and the SiGe fin 150 material that occurs during an anneal step described in FIG. 8A in the first channel region 625.

Structure 780 is a layer of GeO2 782 which is disposed on a layer of SiGe 784 which in turn is disposed on a substrate 786, e.g. a silicon substrate (786, 105, or 110). The GeO2 layer 782 is approximately 3 nm thick and the SiGe layer 784 is approximately 20 nm thick. The SiGe layer 784 has a 20% concentration of Ge. For example, 20% of the atoms in the material are Ge and 80% of the atoms in the material are not Ge, e.g. silicon. Stated another way, 40% of the material is SiGe and the other 60% is silicon and/or other compositions.

Heat is applied 785 in an inert gas environment, e.g. nitrogen, argon, helium, or any combination of thereof. In an embodiment, the structure 780 is raised to a temperature above 500 degrees Celsius in the inert gas environment 785. The inert gas environment is used to prevent O2 from oxidizing the SiGe fin 150 and other exposed materials.

In the reaction that follows, the silicon atoms in layer 784 combine with one of the oxygen atoms in each of two GeO2 molecules creating a SiO2 layer 792 and GeO, a volatile form that leaves the structure as a gas. This occurs because the Si has a lower gibbs free energy than the Ge in a thermal equilibrium state. As the silicon combines with O2, the atomic percentage of Ge in the SiGe layer 784 increases where the GeO2 layer 782 is in contact with the SiGe layer 784 until all the GeO2 is consumed. In this example, the SiGe layer 794 is about 40% atomic concentration of Ge in the structure 790. By initially making the layer 782 thicker, e.g. providing more GeO2, the SiGe layer 794 can have a higher concentration of Ge, since more Si in the layer will be oxidized. Accordingly, the thickness of the SiGe layer 794 and the percentage of Ge in SiGe layer 794 can be controlled by the thickness of the GeO2 layer 782.

The chemical reaction is as follows:

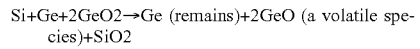

Si+Ge+2GeO2→Ge (remains)+2GeO (a volatile species)+SiO2

Structure 790 results where the silicon substrate 786 is unaffected but the top surface SiGe 20% layer 784 is converted to the higher Ge concentration layer, e.g. SiGe 40% 794 due to the loss of Si atoms by the oxidation of the Si. In other words, each of two molecules of GeO2 gives up an oxygen atom to a silicon atom in the SiGe 20% layer 784 causing the silicon atom to leave layer 784 and form a $SiO_2$ layer 792, i.e. the silicon is oxidized and migrates out of the layer 784. As the silicon atoms leave the top surface of SiGe layer 784, the concentration of Ge in layer 784 increases in this "condensing" process. In an embodiment, the layer 794 of SiGe increases concentration of Ge (to about 40%) and a thickness of about 3 nm is converted at the interface of the GeO2 782 and SiGe 20% 784. Further, a layer 792 of $SiO_2$ with a thickness of about 3 nm is disposed on the layer 794 of SiGe at 40% concentration as a result of the Si being oxidized by the GeO2. Other concentrations in layer 794 are within the contemplated scope of the invention. In alternative embodiments, after the SiO2 layer 792 is removed, another layer of GeO2 782 can be added and the process repeated.

Note that while this reaction proceeds, no reaction occurs where SiGe and GeO2 are not in contact. For example, no reaction occurs between the GeO2 and any of the SiO2, SiN, Si, or any other materials in contact with the GeO2. This allows for the selective condensation of germanium in the first channel region 625.

After the anneal, the volatile species GeO can be extracted, for example, by purging a chamber in which the reaction is conducted with an inert gas.

FIG. 8A is a cross section of the elevation of the FINFET structure after the step of selective Ge condensation and anneal. FIG. 8B (FIG. 8C) is the elevation view B-B (C-C) of FIG. 8A after the step of selective Ge condensation and anneal.

The structure 800 is placed in an inert gas, e.g. nitrogen, environment. Then the structure 800 is raised to a temperature above 500 degrees Celsius. The reaction described in FIG. 7D occurs in the first channel region 625 of the fin 150 where the GeO2 is in physical contact with the top and sides of the fin 150. In the first channel region 625 a layer of SiGe of a higher concentration 850 forms on the surface and top and on the sides of the fin 150.

The higher Ge concentration can form through the entire fin 150 as shown in view A-A of structure 800 and B-B of structure 810. This is enabled by depositing the correct thickness of GeO2 before the anneal. For example, if the fin 150 is between 6-7 nm thick, placing a 3 to 4 nm thickness of GeO2 around both sides of the fin 150 permits condensation of Ge from both sides of the fin 150 into the center of the fin 150. If the GeO2 layer 725 is thick enough, enough Ge is condensed so the anneal reaction can continue until the full thickness of the fin 150 increases the percentage of Ge to a pre-determined amount. Since the thickness of the GeO2 layer is precisely controlled by the ALD, the percent of Ge in the first channel region 625 can be very tightly controlled. The reaction ends when all the GeO2 in layer 725 exposed to the fin 150 in the first channel region 625 completes the reaction. In an embodiment, as stated above, the Ge concentration in the first channel region 625 is between 30% and 60%.

A layer of SiO2 825 remains deposited on the higher Ge concentration SiGe on the top (see structure 800) and sides (see structure 810) of the fin. The SiO2 layer 825 has a thickness between 3 and 5 or about 3 nm. The thickness of the SiO2 layer 825 will be on the order of the thickness of the deposited GeO2 layer 725.

Note that where the GeO2 is not in physical contact with the SiGe outside the first channel region 625 of the fin 150, no reaction occurs during the anneal and the layer 725 of GeO2 remains unchanged.

FIG. 8C is the second elevation view C-C of FIG. 8A after the selective Ge condensation and anneal. View C-C is the cross-section elevation view along the fin 150 in the region still covered by the source side inner spacer 120S. Since the source side inner spacer 120S prevented the GeO2 layer 725 from being in contact with the SiGe fin 150 outside of the first channel region 625, no reaction occurred outside of the first channel region 625 during the anneal and the Ge concentration of the fin 150 remained lower and unchanged in the second channel region below the source side inner spacer 120S. In an embodiment, this lower Ge concentration region remains at its initial Ge concentration of between 10 to 30 percent of Ge. For the same reasons, there is no change in Ge concentration where the fin 150 is covered by ILD 310.

In some embodiments, after the Ge condensation anneal, the first channel region (625, 925 below) Ge concentration 850 is at least 20 percent higher than the second channel region (950, below) Ge concentration (975, below). In addition, due to precise placement of the inner spacers 120, there is a precise boundary 890 created between the first channel region (625, 925) and second channel region 950. There will be an abrupt change of Ge concentration within 1 or 2 nm of the boundary 890.

FIG. 9A is a cross section of the elevation of the FINFET structure after the steps of removing the remaining, unreacted GeO2 layer 725; removing the converted SiO2 layer 825; and removing the source side inner spacer 120S. After this material removal, the first channel region (625, now 925) is exposed. In addition, the region of the fin protected 950 by the source side inner spacer 120S is also exposed as a second channel region 950.

In some embodiments, a hydrogen fluoride (HF), DHF, or BHF etch removes the SiO2 layer 825 and inner source side spacer 120S. The GeO2 layer can be removed by the deionized water, by exposure to the water in the HF, DHF or BHF wet etch chemistries or by direct exposure to the deionized water.

The first channel region (925, 625) has a first length 925L measured laterally along the fin 150 and the second channel region 950 has a second length 950L measured laterally along the fin 150. As stated above, these lengths are accurately and precisely controlled using the methods of this invention.

The total channel length is the sum of the first length 925L and the second length 950L. In an embodiment, first length 925L is between 50-80 percent of the total channel length. In an embodiment, the total channel length is less than 200 nm, alternatively below 40 nm.

The first channel region 925 and the second channel region 950 positions along the fin are also accurately and precisely controlled using the methods of this invention.

FIG. 9B is the first elevation cross section 910 view B-B of FIG. 9A showing the created first channel region 925. The fin 150 in the first channel region 925 has a higher Ge concentration 850.

FIG. 9C is the second elevation cross section 920 view C-C of FIG. 9A showing the created second channel region 950. The second channel region 950 has a lower Ge concentration 975.

Accordingly, the first channel region 925, nearer the drain 210, has a higher Ge concentration 850 and lower Vth than the second channel region 950, nearer the source 220, with a lower Ge concentration 975 and higher Vth. The result is a FINFET with an asymmetric Vth along the channel of the device.

FIG. 10A is a cross section of the elevation of the FINFET structure after the step of forming a gate by depositing a high-k dielectric 1025 and a gate metal 1050.

The gate (1025, 1050) is formed by first depositing a high k dielectric 1025 above the first and second channel regions (925, 950). In some embodiments, the high k dielectric 1025 is deposited along the interior sides of the remaining outside spacers 125 as well.

Gate dielectric material(s) 1025 can be a dielectric material having a dielectric constant greater than 3.9, 7.0, or 10.0. Non-limiting examples of suitable materials for the gate dielectric material 1025 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 1025 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 1025 may vary depending on the deposition process as well as the composition and number of high-k dielectric materials used.

While the gate dielectric material 1025 can be the same for both PFET and NFET devices, the work function material 1050 for the PFET devices will be different than the work function material 1050 for the NFET devices.

The p-type work function metal layers 1050 include but are not necessarily limited to: titanium nitride (TiN), tantalum nitride (TaN) or ruthenium (Ru). These work function metals 1050 are deposited using, for example, deposition techniques including, but not limited to, Chemical Vapor Deposition (CVD), Plasma Enhanced CVD (PECVD), RFCVD, PVD, Atomic Layer Deposition (ALD), PLD, LSMCD, and/or sputtering Chemical Vapor Deposition (CVD), Plasma Enhanced Chemical Vapor Deposition (PECVD), Radio Frequency Chemical Vapor Deposition (RFCVD,) Physical Vapor Deposition (PVD), Atomic Layer Deposition (ALD), Pulsed Laser Deposition (PLD), Liquid Source Misted Chemical Deposition (LSMCD), and/or sputtering. In an embodiment, the work function metal 1050 is deposited by an ALD process.

The n-type work function metal 1050 include, but are not necessarily limited to, TiN, titanium aluminum nitride (TiAlN), titanium aluminum carbon nitride (TiACN), titanium carbide (TiC), titanium aluminum carbide (TiAlC), tantalum aluminum carbide (TaAlC), tantalum aluminum carbon nitride (TaAlCN) or lanthanum (La) doped TiN, TaN. These work function metal materials 1050 deposited using the same methods as for the p-type material.

The work function metal(s) 1050 may be deposited by a suitable deposition process, for example, CVD, PECVD, PVD, plating, thermal or e-beam evaporation, and sputtering.

FIG. 10B is the first elevation cross section 1010 view B-B of the first channel region 925 of FIG. 10A after forming the gate (1025, 1050.) As shown, the gate (1025, 1050) interfaces the top as well as the sides of the first channel region 925.

FIG. 10C is the first elevation cross section 1010 view C-C of the second channel region 950 of FIG. 10A after forming the gate (1025, 1050.) As shown, the gate (1025, 1050) interfaces the top as well as the sides of the second channel region 950.

Figure 11:
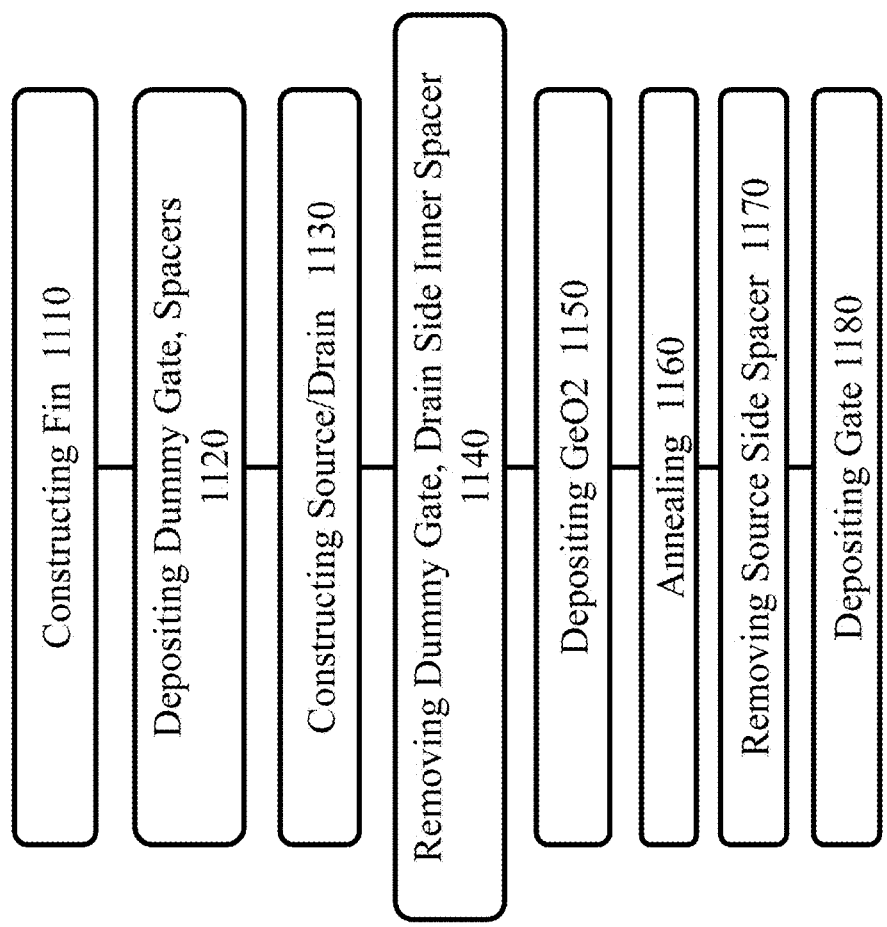
FIG. 11 is a flow chart of a process showing the steps of making a FINFET with an asymmetric Vth along its channel.

FIG. 11 is a flow chart showing a process 1100 with the steps of making a FINFET with an asymmetric Vth along its channel.

Step 1110 begins by constructing one or more fins 150 on a substrate/BOX (105 and/or 110) as explained in the description of FIG. 1.

Step 1120 disposes the dummy gate 115, the source side inner spacer 120S, the drain side inner spacer 120D, the source side outer spacer 125S, and the drain side outer spacer 125D on the top and around the two sides of the fin 150, as described in the description of FIG. 1.

Constructing the source 220 and drain 210 occurs in step 1130 as explained in the description of FIG. 2.

In step 1140 there is the removing of the dummy gate 115 and the drain side inner spacer 120D, as disclosed in the description of FIGS. 3 through 5.

Step 1150 is the step of depositing the layer of GeO2 725 on the first channel region 625.

The annealing in an inert environment occurs in step 1160, as described in FIG. 8A.

In step 1170 there is the removing the source side inner spacer 120S and other material, as described in FIG. 9A.

In step 1180, the gate (1025, 1050) is formed by first depositing a high k dielectric 1025 above the first and second channel regions (925, 950) and then depositing the gate metal 1050, as described in FIG. 10A.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A FinFET comprising:
a channel being made of silicon-germanium (SiGe), the channel having a first channel region on a drain side of the channel, the first channel region having a first Ge concentration, a first length, and a first threshold voltage and the channel having a second channel region on a source side of the channel, the second channel region having a second Ge concentration, a second length, and a second threshold voltage, the sum of the first and second lengths being a total length of the channel;
a source connected to the source side of the channel;
a drain connected to the drain side of the channel,
wherein the first Ge concentration is higher than the second Ge concentration so that an asymmetric threshold voltage exists along the total length.

2. A FinFET, as in claim 1, where the total length is less than 40 nanometers (nm).

3. A FinFET, as in claim 1, where the first length is between 50 to 80 percent of the total channel length.

4. A FinFET, as in claim 1, where the first Ge concentration is between 30 to 60 percent.

5. A FinFET, as in claim 1, where the second Ge concentration is between 10 to 30 percent.

6. A FinFET, as in claim 1, where second threshold voltage is greater than the first threshold voltage by at least 0.1 volts.

7. A FinFET, as in claim 1, where the first threshold voltage is less than 0.3 volts.

8. A FinFET, as in claim 1, where the second threshold voltage is less than 0.5 volts.

9. A FinFET, as in claim 1, where a gate structure encompasses the first and second channel regions by being in contact with a fin top and two sides.

10. A FinFET, as in claim 1, where there is a step change between the first and second threshold voltages of at least 0.1 volts at a boundary between the first and second channel regions.

11. A FinFET, as in claim 10, where the step change occurs within 2 nanometers (nm) of the boundary.

12. A FinFET comprising:
a channel being made of silicon-germanium (SiGe), the channel having a first channel region on a drain side of the channel, the first channel region having a first Ge concentration, a first length, and a first threshold voltage and the channel having a second channel region on a source side of the channel, the second channel region having a second Ge concentration, a second length, and a second threshold voltage, the sum of the first and second lengths being a total length of the channel, the first threshold voltage being less than 0.3 volts and the second threshold voltage being at least 0.1 volts greater than the first threshold voltage;
a source connected to the source side of the channel;
a drain connected to the drain side of the channel;
a boundary between the first and second channel regions, the change between the second threshold voltage and the first threshold voltage occurring within less than 2 nm from the boundary, wherein the first Ge concentration is higher than the second Ge concentration so that an asymmetric threshold voltage exists along the total length.

13. The FinFET, as in claim 12, where the total length of the channel is less than 40 nanometers (nm).

14. The FinFET, as in claim 12, with a dopant concentration in the source and the drain has a range from $4\times10^{20}$ cm$^{-3}$ to $2.5\times10^{21}$ cm$^{-3}$.

15. The FinFET, as in claim 12, where the first Ge concentration is between 30 to 60 percent.

16. The FinFET, as in claim 12, where the second Ge concentration is between 10 to 30 percent.

17. The FinFET, as in claim 12, where the first length is between 50% and 80% of the total length of the channel.

18. The FinFET, as in claim 12, where the first second length is between 20% and 50% of the total length of the channel.

19. The FinFET, as in claim 12, where the second threshold voltage being at least 0.2 volt greater than the first threshold voltage.

20. The FinFET, as in claim 12, further comprising a gate structure that encompasses the first and second channel regions.

* * * * *